(12) United States Patent
Cho et al.

(10) Patent No.: US 9,595,569 B2
(45) Date of Patent: Mar. 14, 2017

(54) SINGLE PHOTON DEVICE, APPARATUS FOR EMITTING AND TRANSFERRING SINGLE PHOTON, AND METHODS OF MANUFACTURING AND OPERATING THE SAME

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Kyung-sang Cho, Yongin-si (KR); Young Kuk, Seoul (KR); Seong-joon Lim, Seoul (KR); Byoung-lyong Choi, Yongin-si (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 14/310,435

(22) Filed: Jun. 20, 2014

(65) Prior Publication Data
US 2014/0374699 A1 Dec. 25, 2014

(30) Foreign Application Priority Data
Jun. 20, 2013 (KR) .................. 10-2013-0071162

(51) Int. Cl.
*H01L 27/30* (2006.01)
*H01L 27/32* (2006.01)
(Continued)

(52) U.S. Cl.
CPC ............ *H01L 27/305* (2013.01); *H01L 27/32* (2013.01); *H01L 51/502* (2013.01); *H04B 10/70* (2013.01);
(Continued)

(58) Field of Classification Search
CPC ..... H01L 27/305; H01L 27/32; H01L 51/502; H04B 10/70
(Continued)

(56) References Cited

U.S. PATENT DOCUMENTS 5,559,330 A * 9/1996 Murashita ................... 850/6
6,583,863 B1 * 6/2003 Smith ................... G01S 7/481
348/135
(Continued)

FOREIGN PATENT DOCUMENTS

KR 10-0754396 B1 8/2007
KR 10-2012-0018865 A 3/2012
(Continued)

OTHER PUBLICATIONS

Englund et al., "Generation and transfer of single photons on a photonic crystal chip", Optics Express 5550, vol. 15, No. 9, Apr. 30, 2007, (c) 2007 Optical Society of America.*
(Continued)

*Primary Examiner* — Jarrett Stark
*Assistant Examiner* — Charles N Ausar-El
(74) *Attorney, Agent, or Firm* — Sughrue Mion, PLLC

(57) ABSTRACT

Provided are single photon devices, single photon emitting and transferring apparatuses, and methods of manufacturing and operating the single photon devices. The single photon device includes a carrier transport layer disposed on a conductive substrate and at least one quantum dot disposed on the carrier transport layer. A single photon emitting and transferring apparatus includes a single photon device, an element that injects a single charge into the single photon device described above, a light collecting unit that collects light emitted from the single photon device, and a light transfer system that transmits light collected by the light collecting unit to the outside.

15 Claims, 2 Drawing Sheets

(51) Int. Cl.
  *H01L 51/50* (2006.01)
  *H04B 10/70* (2013.01)
  *H01L 51/00* (2006.01)
  *H01L 51/42* (2006.01)
  *H01L 27/28* (2006.01)
  *B82Y 20/00* (2011.01)
  *H01L 51/52* (2006.01)

(52) U.S. Cl.
  CPC .............. *B82Y 20/00* (2013.01); *H01L 27/288* (2013.01); *H01L 51/004* (2013.01); *H01L 51/006* (2013.01); *H01L 51/426* (2013.01); *H01L 51/4213* (2013.01); *H01L 51/52* (2013.01)

(58) Field of Classification Search
  USPC .......................................................... 257/13
  See application file for complete search history.

(56) References Cited

U.S. PATENT DOCUMENTS

| | | | | |
|---|---|---|---|---|
| 6,665,486 | B2* | 12/2003 | Tomita | 385/147 |
| 7,019,333 | B1 | 3/2006 | Shields et al. | |
| 8,227,830 | B2 | 7/2012 | Bennett et al. | |
| 2006/0046330 | A1* | 3/2006 | Chen | B82Y 10/00 438/22 |
| 2006/0289853 | A1* | 12/2006 | Chen | B82Y 10/00 257/14 |
| 2007/0170446 | A1* | 7/2007 | Cho et al. | 257/98 |
| 2007/0215856 | A1* | 9/2007 | Kwon et al. | 257/14 |
| 2008/0224596 | A1* | 9/2008 | Park et al. | 313/503 |
| 2008/0227230 | A1* | 9/2008 | Lee et al. | 438/29 |
| 2009/0009057 | A1* | 1/2009 | Lee et al. | 313/503 |
| 2009/0022491 | A1* | 1/2009 | Takemoto | 398/34 |
| 2009/0039764 | A1* | 2/2009 | Cho et al. | 313/504 |
| 2010/0108984 | A1* | 5/2010 | Cho et al. | 257/13 |
| 2010/0123120 | A1* | 5/2010 | Mohseni | 257/21 |
| 2010/0220970 | A1* | 9/2010 | Lin et al. | 385/141 |
| 2010/0224859 | A1* | 9/2010 | Gough et al. | 257/13 |
| 2011/0278641 | A1* | 11/2011 | Grolier | H01L 33/0095 257/102 |
| 2012/0037930 | A1* | 2/2012 | Hoppel | H01L 33/0079 257/88 |
| 2012/0326116 | A1* | 12/2012 | Ellis et al. | 257/9 |
| 2014/0014896 | A1* | 1/2014 | Chung et al. | 257/13 |
| 2014/0185640 | A1* | 7/2014 | Jain | 372/45.011 |
| 2015/0048400 | A1* | 2/2015 | Gootz | H01L 33/0079 257/98 |

FOREIGN PATENT DOCUMENTS

| | | |
|---|---|---|
| KR | 10-2012-0039940 A | 4/2012 |
| KR | 10-2012-0047481 A | 5/2012 |

OTHER PUBLICATIONS

Lutz et al., "Scanning Tunneling Luminescence of Individual CdSe Nanowires", small 2011, 7, No. 16, 2396-2400.*
Hutalgalung et al, "The Ballistic Electron Emission Microscopy in the Characterization of Quantum Dots", Solid State Phenomena vols. 121-123 (2007) pp. 529-532.*
Zhiliang Yuan et al., "Electrically Driven Single-Photon Source", Jan. 4, 2002, vol. 295, 5 pgs. total, Downloaded from www.sciencemag.org on Mar. 10, 2013.
C.B. Murray et al., "Synthesis and Characterization of Monodisperse Nanocrystals and Close-Packed Nanocrystals Assemblies", Annu. Rev. Natter. Sci., 2000, pp. 545-610.

* cited by examiner

SINGLE PHOTON DEVICE, APPARATUS FOR EMITTING AND TRANSFERRING SINGLE PHOTON, AND METHODS OF MANUFACTURING AND OPERATING THE SAME

CROSS-REFERENCE TO RELATED APPLICATIONS

This application claims from Korean Patent Application No. 10-2013-0071162, filed Jun. 20, 2013, in the Korean Intellectual Property Office, the disclosure of which is incorporated herein in its entirety by reference.

BACKGROUND

1. Field

The present disclosure relates to photon devices, and more particularly, to single photon devices, single photon emitting and transferring apparatuses, and methods of manufacturing and operating the same.

2. Description of the Related Art

Chemically synthesized colloidal quantum dots range in size from about 1.5 nm to about 10 nm. Colloidal quantum dots are characterized in that their band gap varies according to the size of the colloidal quantum dots as a result of a quantum confinement effect.

A colloidal quantum dot includes a core formed from an inorganic material and an organic ligand. The organic ligand is needed for chemical synthesis and solution distribution, and protects the core.

The phenomenon of injecting a single charge (i.e., an electron) into a quantum dot may be observed via the coulomb blockade phenomenon. For example, when a single charge is injected into a quantum dot, a staircase-shaped current jump, which is referred as a staircase, occurs in a current-voltage graph. From this phenomenon, the injection of a single charge into a quantum dot may be confirmed.

A single photon device may be used in studies of quantum computing or quantum information by using light, and may be used to manufacture a device related to the these studies. Existing single photon devices are manufactured mainly in a photonic crystal shape or a bulk p-i-n shape.

SUMMARY

One or more exemplary embodiments provided single photon devices that can electrically excite a single quantum dot and can precisely control the injection of charges and discharge of photons.

One or more exemplary embodiments also provide apparatuses for emitting and transferring a single photon.

One or more exemplary embodiments also provide methods of manufacturing and operating a single photon device.

According to an aspect of an exemplary embodiment, there is provided a single photon device including: a substrate; a carrier transport layer disposed on the substrate; and at least one quantum dot disposed on the carrier transport layer.

The carrier transport layer may be a hole transport layer.

The single photon device may further include a quantum dot film that includes the at least one quantum dot, wherein the quantum dot film is formed on the carrier transport layer.

According to an aspect of another exemplary embodiment, there is provided a single photon-emitting and transferring apparatus including: a single photon device; an element that injects a single charge into the single photon device; a light collecting unit that collects light emitted from the single photon device; and a light transfer system that transmits the light collected by the light collecting unit to the outside, wherein the single photon device includes: a substrate; a carrier transport layer provided on the substrate; and at least one quantum dot existing on the carrier transport layer.

The element that injects a single charge may be a scanning tunneling microscope (STM) tip.

According to another aspect of another exemplary embodiment, there is provided a method of manufacturing a single photon device, the method including: forming a carrier transport layer on a conductive substrate and forming on the carrier transport layer at least one quantum dot that emits a single photon.

According to another aspect of another exemplary embodiment, there is provided a method of operating a single photon device that includes a conductive substrate and at least one quantum dot, and includes a carrier transport layer interposed between the conductive substrate and the quantum dot, the method including: injecting a single charge into the at least one quantum dot; and injecting a hole into the at least one quantum dot through the carrier transport layer.

The injecting of the single charge and the single hole into the at least one quantum dot includes: placing an STM tip above the at least one quantum dot; and injecting the single charge and the single hole into the at least one quantum dot by applying a voltage between the STM tip and the conductive substrate.

The single photon device according to the current embodiment includes a conductive substrate, a hole transport layer, and a single colloidal quantum dot, and uses an STM tip. The hole transport layer is provided between the conductive substrate and the STM tip, and thus, a single charge (an electron) may be injected into a single quantum dot, and the transportation of the hole to the quantum dot may be easy. Also, since an energy band between the quantum dot and an electrode may be controlled in this manner, exciton quenching may be prevented, and accordingly, the emission efficiency of the single photon may be increased.

Also, for example, a single quantum dot may be electrically excited by injecting a single electron into a single quantum dot, and as such the operation of the single photon device may be precisely controlled.

Also, it may be possible to obtain local energy band information required to operate the single photon device and to optimize the single photon device in-situ using the STM tip.

BRIEF DESCRIPTION OF THE DRAWINGS

The above and/or other aspects will become apparent and more readily appreciated from the following description of exemplary embodiments, taken in conjunction with the accompanying drawings of which.

DETAILED DESCRIPTION

Figure 1:
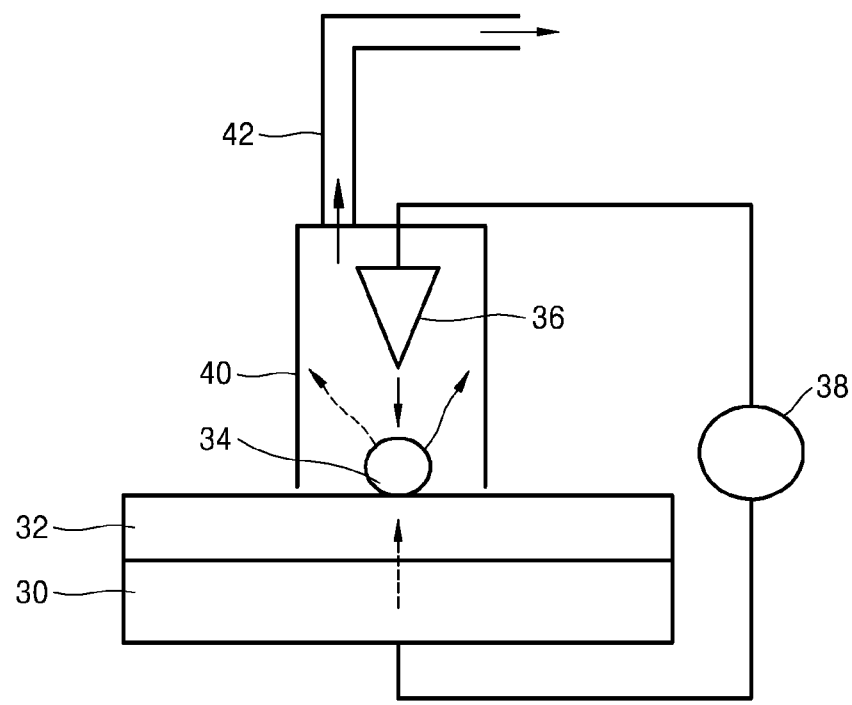
FIG. 1 is a cross-sectional view of a single photon device and an apparatus for emitting and transferring a single photon, according to an exemplary embodiment.

Single photon devices, apparatuses for emitting and transferring a single photon, and methods of manufacturing and operating single photon devices according to exemplary embodiments will be described with reference to the accompanying drawings. In the drawings, lengths and sizes of layers and regions are not necessarily drawn to scale and may be exaggerated for the sake of clarity.

First, a single photon device and an apparatus for emitting and transferring a single photon including the single photon device according to an exemplary embodiment will be described.

FIG. 1 is a cross-sectional view of a single photon device and an apparatus for emitting and transferring a single photon including the single photon device, according to an exemplary embodiment. Referring to FIG. 1, a carrier transport layer 32 is formed on a substrate 30. The substrate 30 may be a conductive substrate, and for example, may be formed from gold or other metals, or may be a conductive substrate containing a metal component. The carrier transport layer 32 may be, for example, a hole transport layer. The carrier transport layer 32 may range in thickness from about 1 nm to about 500 nm. The hole transport layer may be, for example, a poly[(9,9-dioctylfluorenyl-2,7-diyl)-co-(4,40-(N-(4-sec-butylphenyl))diphenylamine (TFB) layer, a N,N'-diphenyl-N,N'-bis(3-methylphenyl)-(1,1'-biphenyl)-4,4'diamine (TPD) layer, a polyvinylcarbazole (PVK) layer, a p-TPD layer, an inorganic p-type oxide layer, or an inorganic p-type semiconductor layer. The inorganic p-type oxide layer may be, for example, an NiO layer. The inorganic p-type semiconductor layer may be, for example, a CuS layer or a ZnTe layer. A single quantum dot 34 is disposed on the carrier transport layer 32. The quantum dot 34 may be a colloidal quantum dot. The quantum dot 34 may include CdSe, CdS, CdTe, InP, ZnSe, ZnS, PbS, PbSe, PbTe, CdSe/CdS, or CdSe/CdS/ZnS. A light collecting unit 40 is formed on the carrier transport layer 32. The light collecting unit 40 is separated from the carrier transport layer 32. The light collecting unit 40 collects light emitted from the quantum dot 34 and delivers the light to a light transfer system 42. The light collecting unit 40 may include a light collecting element or an optical element (or an optical device) (not shown) for collecting the light emitted from the quantum dot 34. The light collecting element or the optical element may be, for example, a Near-Field Scanning Optical Microscope (NSOM). The light transfer system 42 may be connected to the optical element. Light collected by the light collecting unit 40 is transmitted to places where the light is needed through the light transfer system 42. A device or a system for handling an optical signal may be connected to the light transfer system 42. The light transfer system 42 may be an optical wave guide, for example, an optical fiber. For convenience, the light collecting unit 40 and the light transfer system 42 together are referred to herein as a 'light collection-transfer unit'.

Figure 4:
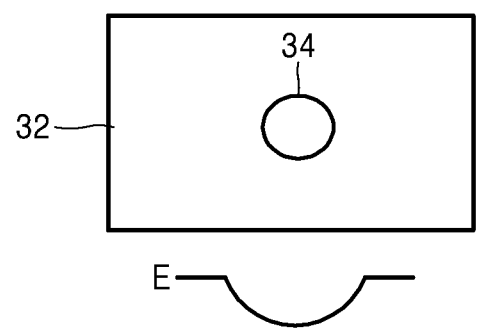
FIG. 4 is a cross-sectional view showing the variation of energy level around a quantum dot located on a carrier transport layer in the single photon devices of FIGS. 1 through 3.

A scanning tunneling microscope (STM) tip 36 may be provided in the light collecting unit 40. The STM tip 36 may be disposed so as to face the quantum dot 34. For example, the STM tip 36 may be disposed directly above the quantum dot 34. The STM tip 36 may be present in a position not directly above the quantum dot 34, if necessary. For example, the STM tip 36 may be disposed so as to horizontally face the quantum dot 34. When the quantum dot 34 is disposed on the carrier transport layer 32, as depicted in FIG. 4, an energy level (E) around the quantum dot 34 is changed. The position of the single quantum dot 34 may be found by detecting the variation of the energy level using the STM tip 36, and accordingly, the STM tip 36 may be positioned close to the single quantum dot 34. The STM tip 36 may be formed from a material selected from the group consisting of, for example, tungsten, molybdenum, gold, aluminum, and silver.

Next, the STM tip 36 is connected to an end of a power source 38. The power source 38 may be disposed outside the light collecting unit 40. The other end of the power source 38 is connected to the substrate 30.

In FIG. 1, the configuration that includes the substrate 30, the carrier transport layer 32, and the quantum dot 34 (in the case of FIG. 3, a quantum dot film 60) may be a configuration of a device that emits a single photon, i.e., a single photon device. A configuration that further includes the STM tip 36, the light collecting unit 40, and the light transfer system 42 may be a configuration of a single photon emitting and transferring apparatus.

Hereinafter, the injection of a carrier into the quantum dot 34 and the process of emitting light from the quantum dot 34 by injecting the carrier will be briefly described.

When a potential difference is formed between the STM tip 36 and the substrate 30 by the power source 38, charges, for example, electrons, are emitted from the STM tip 36, and are injected into the quantum dot 34. At this point, a single charge (electron) may be injected into the quantum dot 34 by controlling the current.

In this way, when a single charge is injected into the quantum dot 34 from the STM tip 36, a hole is simultaneously injected into the quantum dot 34 from the substrate 30 through the carrier transport layer 32. The electron and the hole that are injected into the quantum dot 34 form an exciton in the quantum dot 34. When the exciton disappears, light having energy corresponding to a band gap of the quantum dot 34 is emitted from the quantum dot 34.

When a single charge is injected into the quantum dot 34 by controlling the bias and current of the STM tip 36, a single exciton is formed in a single quantum dot 34. That is, a single photon may be emitted from the single quantum dot 34 by controlling the bias and current of the STM tip 36. The STM tip 36 is one of various elements that may inject a single charge into the single quantum dot 34. Accordingly, any element (a device, an apparatus, or a system) that may inject a single charge into the single quantum dot 34 may be used as an alternative to the STM tip 36.

Figure 2:
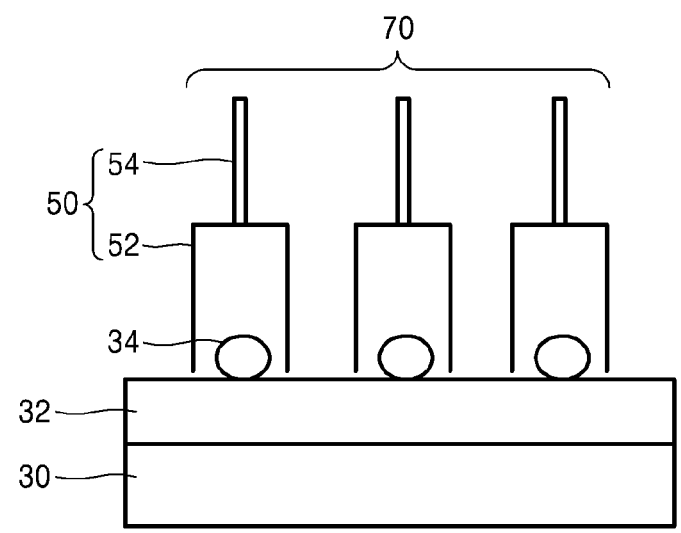
FIG. 2 is a cross-sectional view of a single photon device and an apparatus for emitting and transferring a single photon, according to another exemplary embodiment.

FIG. 2 is a cross-sectional view of a single photon device according to another exemplary embodiment. For the sake of brevity, only differences from the single photon device of FIG. 1 are described below.

Referring to FIG. 2, a plurality of light collection-transfer units 50 is provided on the carrier transport layer 32. The light collection-transfer units 50 may form a light collection-transfer array 70. In FIG. 2, for convenience of explanation, three light collection-transfer units 50 are depicted, but the light collection-transfer array 70 may include more or less than three light collection-transfer units 50. Each of the light collection-transfer units 50 includes a light collecting unit 52 and a light transfer system 54 that is connected to the light collecting unit 52. The light transfer system 54 may be the same as the light transfer system 42 of FIG. 1. The configuration and performance of the light collecting unit 52 may be the same as that of the light collecting unit 40 of FIG. 1. An STM tip may be included in each light collecting unit 52 as in the light collecting unit 40 of FIG. 1. However, for convenience of explanation, the STM tip is not shown in FIG. 2. A plurality of quantum dots 34 are adsorbed on the carrier transport layer 32. The light collecting units 52 respectively correspond to the quantum dots 34. That is, the STM tips respectively correspond to the quantum dots 34. Accordingly, single charges may be individually injected into the quantum dots 34 through the STM tips, and simultaneously, holes may be each injected into the quantum dots 34 through the carrier transport layer 32. As a result, excitons are formed in each of the quantum dots 34, and when the excitons disappear, light having energy corresponding to the energy band gap of each of the quantum dots 34 is emitted from each of the quantum dots 34. Light emitted in this way is collected by the light collection-transfer array 70, and is delivered to, for example, an optical signal processing apparatus or an optical signal analysis apparatus through the light transfer system 54.

Figure 3:
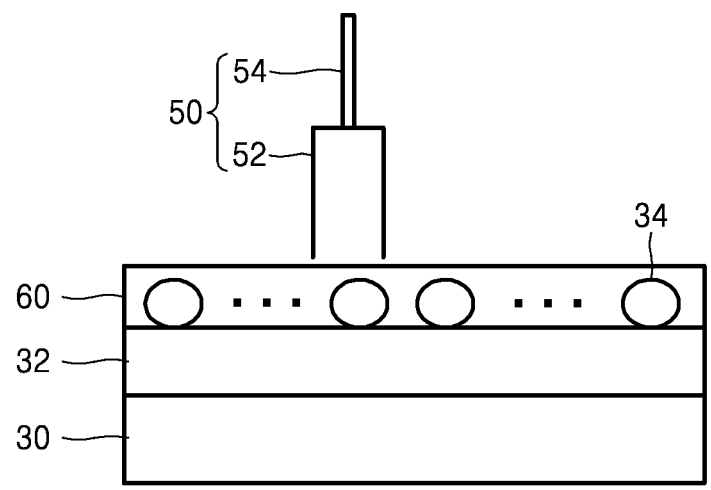
FIG. 3 is a cross-sectional view showing a quantum dot film formed on a carrier transport layer in the single photon devices of FIGS. 1 and 2.

FIG. 3 is a cross-sectional view showing a quantum dot film 60 formed on the carrier transport layer 32 in the single photon devices of FIGS. 1 and 2. The quantum dot film 60 includes a plurality of quantum dots 34.

Referring to FIG. 3, the quantum dot film 60 covers an entire upper surface of the carrier transport layer 32. The quantum dot film 60 may be formed by baking a material that includes the quantum dots 34 after coating the material on the carrier transport layer 32 using a spin coating method. Light collection-transfer units 50 are formed on the quantum dot film 60. The light collection-transfer array 70 of FIG. 2 may also be provided on the quantum dot film 60.

Next, a method of manufacturing a single photon-emitting device (a single photon device) according to an exemplary embodiment will be briefly described with reference to FIG. 3.

The carrier transport layer 32 is formed on the conductive substrate 30. The carrier transport layer 32 may be a hole transport layer. The quantum dot film 60 is formed on the carrier transport layer 32. The quantum dot film 60 may be formed by using a spin coating method. Instead of the quantum dot film 60, a single quantum dot 34 or a plurality of quantum dots 34 may be formed.

Next, a method of operating the single photon device will be described with reference to FIG. 1.

The STM tip 36 is placed on the quantum dot 34. A potential difference is formed between the STM tip 36 and the substrate 30. That is, a voltage is applied to the STM tip 36 and the substrate 30. At this point, a single charge may be injected into the quantum dot 34 from the STM tip 36 by controlling a current that is applied to the STM tip 36, and a single hole may be injected into the quantum dot 34 from the substrate 30 through the carrier transport layer 32. As a result, a single photon may be emitted from the quantum dot 34, as described above. The single photon emitted from the quantum dot 34 is delivered to the outside through the light collecting unit 40 and the light transfer system 42.

It should be understood that the exemplary embodiments described herein should be considered to be descriptive only and not limiting. Descriptions of features or aspects within each embodiment should typically be considered as being available for other similar features or aspects in other embodiments.

What is claimed is:

1. A single photon-emitting and transferring apparatus comprising:
a single photon device;
an element that injects a single charge into the single photon device;
a light collecting unit that collects light emitted from the single photon device; and
a light transfer system that transmits the light collected by the light collecting unit externally,
wherein the single photon device comprises:
a substrate;
a carrier transport layer disposed on the substrate; and
at least one quantum dot disposed on the carrier transport layer,
wherein the carrier transport layer is disposed between the at least one quantum dot and the substrate; and
wherein the single photon device and the element that injects the single charge into the single photon device are arranged such that the single charge is emitted directly into the at least one quantum dot in the single photon device.

2. The single photon emitting and transferring apparatus of claim 1, wherein the element that injects the single charge is a scanning tunneling microscope tip.

3. The single photon emitting and transferring apparatus of claim 1, wherein the light transfer system is an optical fiber.

4. The single photon emitting and transferring apparatus of claim 1, wherein the carrier transport layer is a hole transport layer.

5. The single photon emitting and transferring apparatus of claim 4, wherein the hole transport layer is one of a poly[(9,9-dioctylfluorenyl-2,7-diyl)-co-(4,40-(N-(4-sec-butylphenyl))diphenylamine (TFB) layer, a N,N'-diphenyl-N, N'-bis(3-methylphenyl)-(1,1'-biphenyl)-4,4'diamine (TPD) layer, a polyvinylcarbazole (PVK) layer, a p-TPD layer, an inorganic p-type oxide layer, and an inorganic p-type semiconductor layer.

6. The single photon emitting and transferring apparatus of claim 5, wherein the hole transport layer is an NiO layer.

7. The single photon emitting and transferring apparatus of claim 5, wherein the hole transport layer is a CuS layer or a ZnTe layer.

8. A method of operating a single photon device that comprises a conductive substrate and at least one quantum dot, the method comprising:
injecting from an STM tip a single charge directly into the at least one quantum dot; and
injecting a hole into the at least one quantum dot through a carrier transport layer,
wherein the carrier transport layer is interposed between the conductive substrate and the quantum dot.

9. The method of claim 8, wherein the injecting of the single charge and the single hole into the at least one quantum dot comprises:
placing the STM tip above the at least one quantum dot; and
injecting the single charge and the single hole into the at least one quantum dot by applying a voltage between the STM tip and the conductive substrate.

10. The method of claim 8, wherein the carrier transport layer is one of poly[(9,9-dioctylfluorenyl-2,7-diyl)-co-(4, 40-(N-(4-sec-butylphenyl))diphenylamine (TFB) layer, a N,N'-diphenyl-N,N'-bis(3-methylphenyl)-(1,1'-biphenyl)-4, 4'diamine (TPD) layer, a polyvinylcarbazole (PVK) layer, a p-TPD layer, an inorganic p-type oxide layer, and an inorganic p-type semiconductor layer.

11. The method of claim 8, wherein the at least one quantum dot is included in a quantum dot film that is formed on the carrier transport layer.

12. The single photon-emitting and transferring apparatus of claim 4, wherein the hole transport layer is an NiO layer, a CuS layer, or a ZnTe layer.

13. The single photon-emitting and transferring apparatus of claim 4, wherein an element of the single photon device that is closest to the element that injects a single charge into the single photon device is the at least one quantum dot disposed on the hole transport layer.

14. The single photon emitting and transferring apparatus of claim 4, wherein the hole transport layer is one of a poly[(9,9-dioctylfluorenyl-2,7-diyl)-co-(4,40-(N-(4-sec-butylphenyl))diphenylamine (TFB) layer, a N,N'-diphenyl-N,N'-bis(3-methylphenyl)-(1,1'-biphenyl)-4,4'diamine (TPD) layer, a polyvinylcarbazole (PVK) layer, and a p-TPD layer.

15. The method of claim 8, wherein the carrier transport layer is one of poly[(9,9-dioctylfluorenyl-2,7-diyl)-co-(4,40-(N-(4-sec-butylphenyl))diphenylamine (TFB) layer, a N,N'-diphenyl-N,N'-bis(3-methylphenyl)-(1,1'-biphenyl)-4,4'diamine (TPD) layer, a polyvinylcarbazole (PVK) layer, and a p-TPD layer.

* * * * *